(12) United States Patent
Tan et al.

(10) Patent No.: US 6,864,423 B2
(45) Date of Patent: Mar. 8, 2005

(54) BUMP CHIP LEAD FRAME AND PACKAGE

(75) Inventors: Aik Chong Tan, Johor Bahru (MY); Chong Un Tan, Negeri Sembilan (MY); Chee Chuan Chew, Petaling Jaya (MY)

(73) Assignee: Semiconductor Component Industries, L.L.C., Phoenix, AZ (US)

( * ) Notice: Subject to any disclaimer, the term of this patent is extended or adjusted under 35 U.S.C. 154(b) by 24 days.

(21) Appl. No.: 09/736,462

(22) Filed: Dec. 15, 2000

(65) Prior Publication Data
US 2002/0074147 A1 Jun. 20, 2002

(51) Int. Cl.⁷ ............................................. H01L 23/28
(52) U.S. Cl. .................... 174/52.2; 174/52.4; 257/676; 257/738; 257/778

(58) Field of Search ................................ 174/52.4, 52.2; 257/787, 796, 707, 676, 778

(56) References Cited

U.S. PATENT DOCUMENTS

| | | | | | |
|---|---|---|---|---|---|
| 6,018,189 A | * | 1/2000 | Mizuno | ...................... | 257/668 |
| 6,191,494 B1 | * | 2/2001 | Ooyama et al. | ............ | 257/796 |
| 6,198,171 B1 | * | 3/2001 | Huang et al. | ............... | 257/787 |
| 6,376,921 B1 | * | 4/2002 | Yoneda et al. | .............. | 257/787 |

* cited by examiner

Primary Examiner—Hung V. Ngo

(57) ABSTRACT

A lead frame with a plurality of bump terminals is provided. Stamping an indentation into each lead in the lead frame forms the bump terminals. The bump terminals will be used as contact points in a completed semiconductor device.

9 Claims, 5 Drawing Sheets

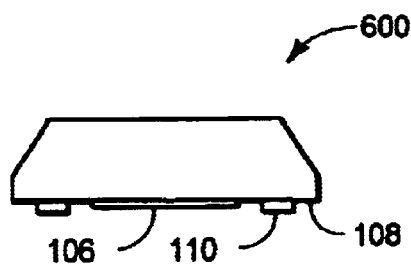
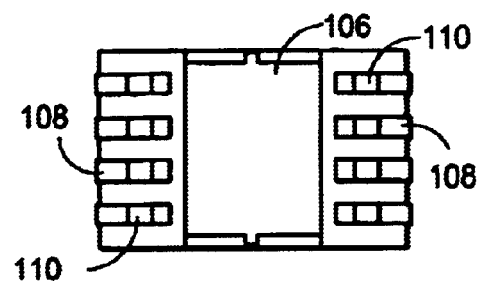
FIG. 6A  FIG. 6B
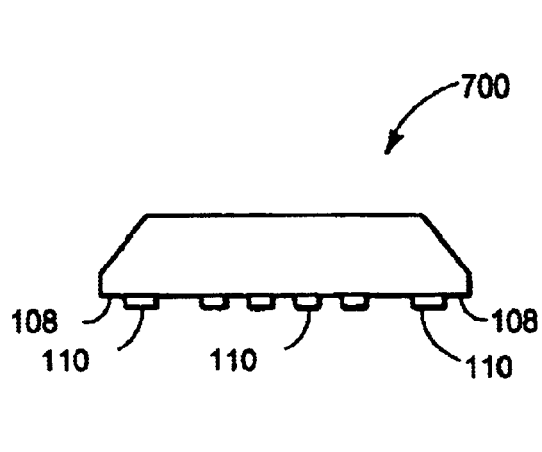
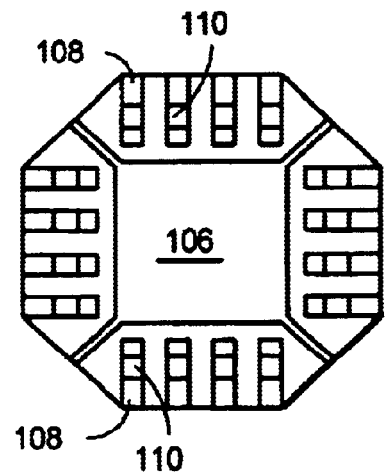
FIG. 7A  FIG. 7B

BUMP CHIP LEAD FRAME AND PACKAGE

FIELD OF THE INVENTION

This invention relates to semiconductor packaging and, more particularly, to a bump chip lead frame and package.

BACKGROUND OF THE INVENTION

With pressure for miniaturization of end-user consumer products, there is continuing pressure to reduce the size of semiconductor packages that are used in such products, while at the same time providing greater functionality with the smaller semiconductor packages. This has resulted in a variety of surface mount semiconductor packages having smaller package outlines and a greater number of inputs and outputs.

One such package is known as the bumped chip carrier (BCC) package. A BCC package contains a semiconductor die that is connected via interconnecting wires to a plurality of terminals. The semiconductor die and the interconnecting wires are encapsulated in mould compound with the terminals exposed and secured onto the surface of the package.

The BCC package is formed by first forming a patterned layer of resist on an upper surface of a sheet of copper alloy. The patterned layer of resist has openings, and a half-etching process is used to etch cavities in the copper alloy at the openings. Then, layers of plating are formed on the inside surface of the cavities and the layer of resist is removed, forming a copper alloy substrate.

A semiconductor die is centrally mounted on the copper alloy substrate, and gold bumps are bonded to the layers of plating. Interconnecting wires are connected between the semiconductor die and the gold bumps. The semiconductor die, the interconnecting wires, the gold bumps, and the cavities are then encapsulated using a mould compound. The copper alloy substrate is dissolved away, leaving the plating layers, resembling small bumps, exposed to form the terminals. Such a structure is disclosed in European Patent Application EP 0773584A2, as entitled "Device Having Resin Package and Method of Produce the Same".

There are several disadvantages associated with the BCC package including the difficulty of controlling the etching process to form the cavities on the copper substrate, and the final process of dissolving the copper alloy substrate. Such processes can adversely affect the integrity of the plating layer and also adversely affect mould locking between the semiconductor die and the mould compound. Another disadvantage is the need and cost of gold bumping which requires a specialized and dedicated machine. In addition, the relatively high cost of using and forming the copper alloy substrate, and later removing the copper alloy substrate altogether is another disadvantage.

BRIEF DESCRIPTION OF THE DRAWINGS

For a more complete understanding of the present invention and advantages thereof, reference is now made to the following descriptions, taken in conjunction with the following drawings, in which like reference numerals represent like parts, and in which:

FIG. 6a and 6b illustrate a side view and bottom view of a two-sided embodiment of the present invention;

FIG. 7a and 7b illustrate a side view and bottom view of a four-sided embodiment of the present invention;

DETAILED DESCRIPTION OF THE DRAWINGS

Figure 1:
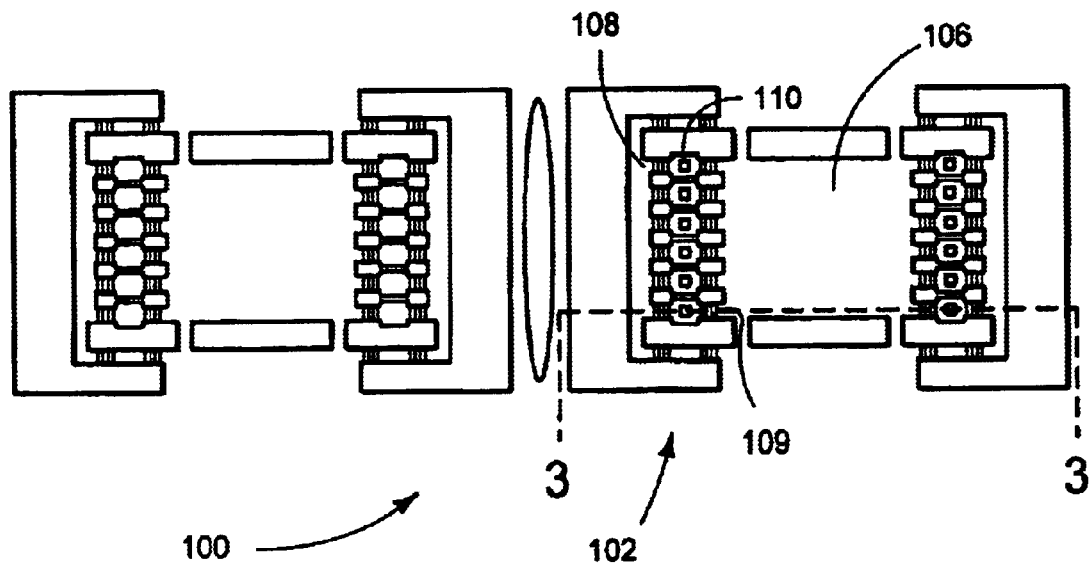
FIG. 1 illustrates a lead frame in accordance with the present invention.

FIG. 1 illustrates a lead frame 100 in accordance with the teachings of the present invention. Lead frame 100 comprises one or more assemblies 102. Each assembly 102 includes a die carrier 106 and a plurality of leads 108. In the present invention leads 108 have an indentation formed in each lead which are known as bump terminals 110. Bump terminal 110 will be used to attach the completed semiconductor device to a printed circuit board or other structure. Optionally, a series of notches 109, preferably v-shaped, are formed on the leads to provide for stress relief during bump formation.

Figure 2:
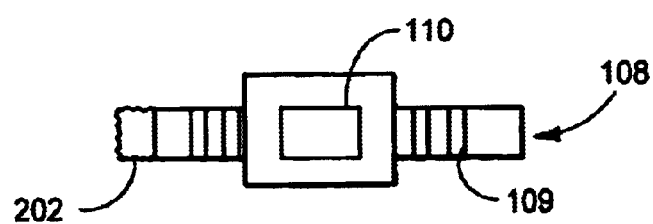
FIG. 2 is a top view of a lead in accordance with the teachings of the present invention.

FIG. 2 is a top view of lead 108 in accordance with the teachings of the present invention. Illustrated is lead 108 with bump terminal 110 and notches 109. Other optional stress relief measures may include stress tabs 202 at one end of leads 108.

Figure 3A:
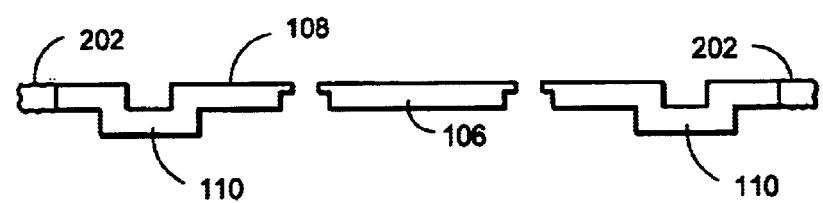
FIG. 3a illustrates a cross-section of the lead frame in accordance with the present invention.
Figure 3B:
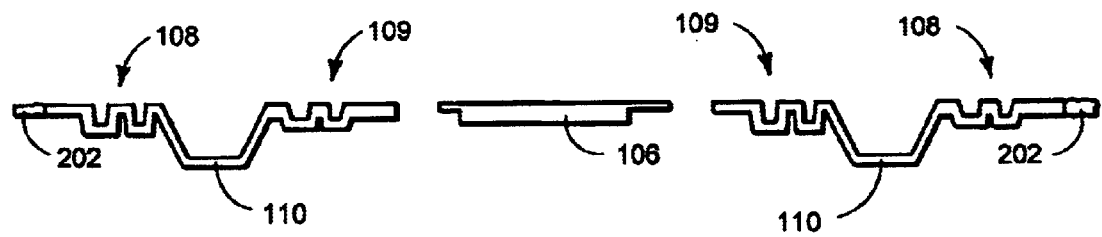
FIG. 3b is a cross-section of the lead frame with stress relief.

FIG. 3a illustrates a cross-section of the lead frame 100 of the present invention along the line 3 of FIG. 1. Illustrated is die carrier 106 and leads 108 with bump terminals 110. At the end of leads 108 are stress relief tabs 202. These release stamping stress during the formation of bump terminals 110, which is further described in FIG. 3. Alternatively, notches 109 can be formed directly on leads 108 to serve as stress relief during bump formation. FIG. 3b illustrates an embodiment with notches 109.

In FIG. 3a and FIG. 3b, it can be seen that bump terminals 110 are below the level of die carrier 106. The top of die carrier 106 is at the same level as the raised portions of leads 108. In one embodiment leads 108 are manufactured from copper, although any conventional conductive material may be used.

Figure 4A:
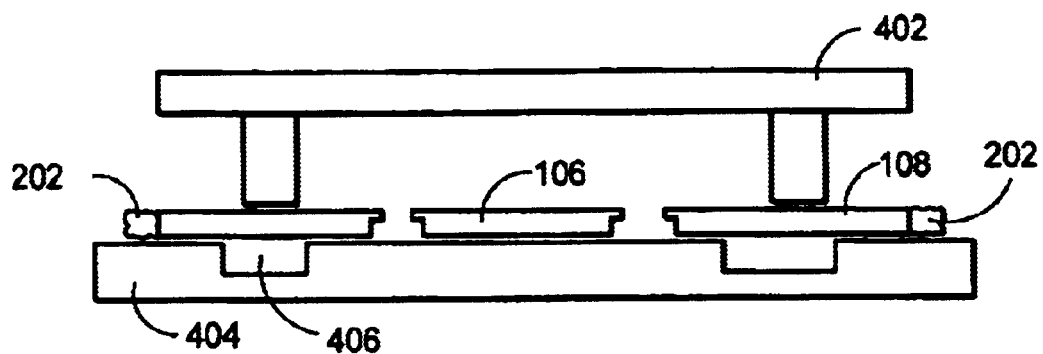
FIG. 4a and 4b illustrate the formation of a bump terminal in accordance with present invention.
Figure 4B:
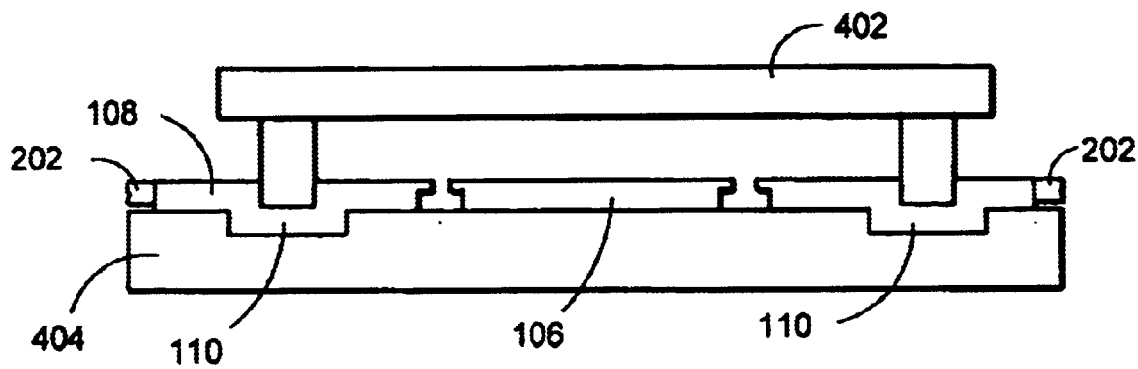

FIG. 4a and 4b illustrate an exemplary way to produce bump terminal 110 in a lead frame. Illustrated in FIG. 4a is a stamping tool 402, a bump cavity block 404 with a plurality of opening 406 and a cross-section of assembly 102 of lead frame 100 with optional notches 109. The stamping tool 402 is operable to press down on leads 108 to form bump terminals 110, as seen in FIG. 4b. While these figures illustrate the formation of bump terminals 110 on a signal terminal, a stamping tool 402 could be designed to stamp any number of assemblies. The shape and design of stamping tool is for exemplary purpose only. Any tool operable to mechanically form bump terminals are within the scope of the present invention. could be designed to stamp any number of assemblies. The shape and design of stamping tool is for exemplary purposes only. Any tool operable to mechanically form bump terminals are within the scope of the present invention.

Figure 5:
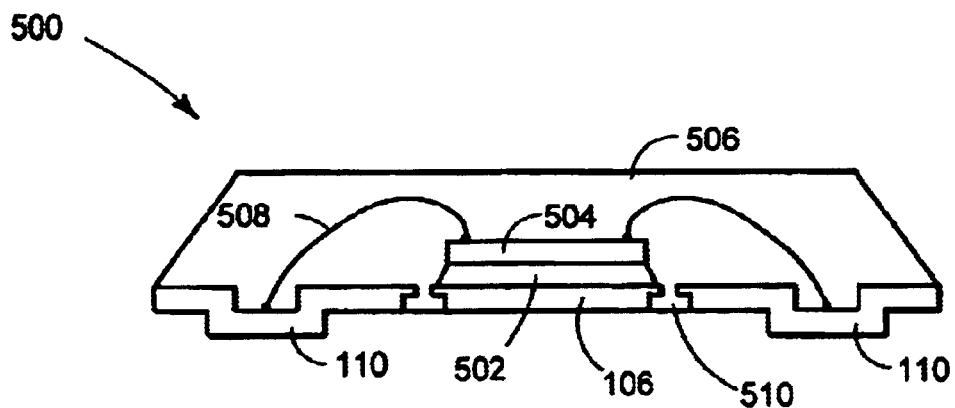
FIG. 5 illustrates a cross-section of a semiconductor device utilizing the present invention.

FIG. 5 illustrates a cross-sectional view of a semiconductor device 500 utilizing the lead frame of the present invention. Illustrated is die carrier 106 with a die 504 placed over die carrier 106 with an adhesive layer 502 applied between. Adhesive layer 502 can be conductive or nonconductive (depending on the application). Die 504 is electrically connected to bump terminal 110 via wire 508 applied using conventional wire bonding materials and techniques. In one embodiment, wires 508 connects die 504 and the indentions formed by bump terminals 110.

An encapsulant 506 covers the top portion of semiconductor device 500 leaving bump terminals 110 exposed. Encapsulant 506 can be any encapsulant applied in any traditional manner such as in an one-sided encapsulation process. In one embodiment, tape molding is used. In this embodiment a layer of tape such as adhesive polymide of tape is applied over the bottom portion of semiconductor device 500 and over the bump terminals. Then, the semiconductor device is placed in a mold and encapsulated. The mold and tape are then removed and the individual devices are separate. Tape molding process are well known in the art.

Encapsulant 506 is generally applied to an entire lead frame and the individual devices are then separated. By applying encapsulant only to one side of semiconductor device 500, no further processing, such as etching or other removal of encapsulant molded directly to the bump terminals 110 needs to be done providing an advantage over the prior art. Application of encapsulant 506 provides for mold lock region 510, which helps to keep the spacing between die carrier 106 and leads 108 intact as well as provide for enhanced mechanical adhesion between the lead frame and molding compound.

FIG. 6a illustrates a side view of a two-sided package 600 in accordance with the teachings of the present invention. Shown are leads 108, bump terminals 110 and die carrier 106. FIG. 6b illustrates a top view of a two-sided package 600 in accordance with the teachings of the present invention. Illustrated are two rows of bump terminals 110 with associated leads 108. Also visible is die carrier 106. The number of leads 108 per side is for illustration purposes only.

FIG. 7a illustrates a side view of a four-sided package 700 in accordance with the teachings of the present invention. Shown are leads 108 and bump terminals 110. FIG. 7b illustrates a top view of a four-sided package 700 in accordance with the teachings of the present invention. Illustrated are four rows of bump terminals 110 with associated leads 108. Also visible is die carrier 106. The number of bump terminals and rows of bump terminals is based on the needs of the device and FIGS. 6a, 6b, 7a and 7b are for illustration purposes only.

Figure 8:
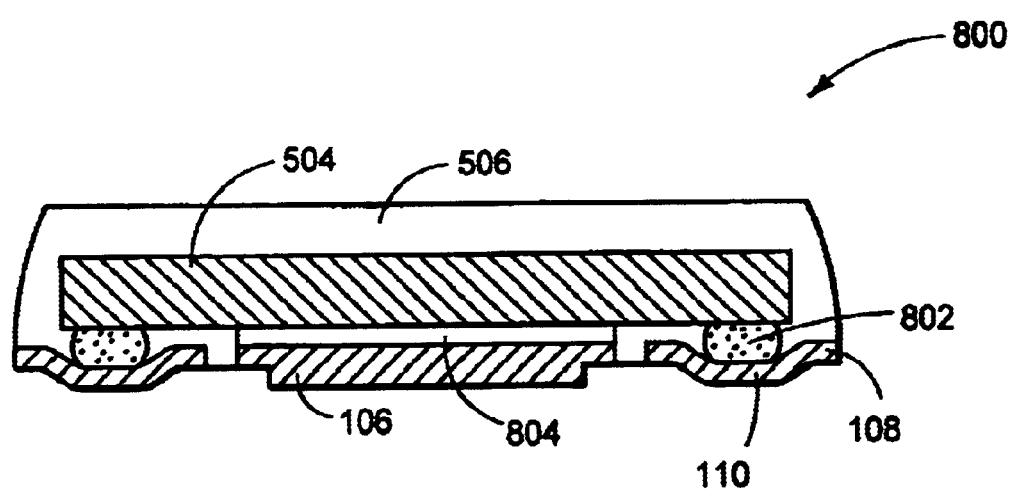
FIG. 8 illustrates an embodiment of the present invention using a flip chip die.

FIG. 8 is an alternative embodiment of the present invention utilizing a flip chip die. A flip chip die is a semiconductor die that has solder pads (or other conductive connection areas) formed directly on the die. Thus, the die can be directly connected to other components (or a lead frame) without the need for wire bonding or similar techniques. FIG. 8 illustrates a device 800 with a semiconductor die 504 having a plurality of connection areas 802 (which can be solder bumps, gold bumps, conductive polymer bumps or bumps made from any other conductive materials capable of connecting a semiconductor die to a lead frame) formed thereon. Connection areas 802 attach to bump terminals 110. Semiconductor die 504 is supported by die carrier 106 with a layer of nonconductive material 804 such as epoxy or elastomer in the middle. This embodiment allows for the use of a flip chip semiconductor with the bump terminals of the present invention.

Although the present invention has been described in several embodiments, a myriad of changes, variations, alterations, transformations and modifications may be suggested to one skilled in the art. It is intended that the present invention encompass such changes, variations, alterations, transformations and modifications and that they fall within the spirit and scope of the appended claims.

What is claimed is:

1. A packaged semiconductor device comprising:
    a leadframe having a die carrier and a plurality of leads having a first surface formed having bump indentations and a second surface formed having bump terminals; and
    a semiconductor die having a surface supported by the die carrier, wherein the surface is formed with a plurality of conductive bumps for attaching to the plurality of bump indentations.

2. The packaged semiconductor device of claim 1, wherein the top of the leads are coplanar with a die carrier.

3. The packaged semiconductor device of claim 1, wherein the device is encapsulated using a one sided process.

4. The packaged semiconductor device of claim 1, further comprising a mold lock region.

5. The packaged semiconductor device of claim 1, further comprising two rows of leads.

6. The packaged semiconductor device of claim 1, further comprising four rows of leads.

7. The packaged semiconductor device of claim 1, wherein the bump indentations are v-shaped.

8. The package semiconductor device of claim 1, wherein an outer portion or the plurality of leads is coplanar with an outer portion of the packaged semiconductor device.

9. The packaged semiconductor device of claim 1, wherein the die carrier and the plurality of leads comprise a same material.

* * * * *